United States Patent [19]

Kushima et al.

[11] Patent Number: 4,906,823
[45] Date of Patent: Mar. 6, 1990

[54] SOLDER CARRIER, MANUFACTURING METHOD THEREOF AND METHOD OF MOUNTING SEMICONDUCTOR DEVICES BY UTILIZING SAME

[75] Inventors: Tadao Kushima, Ibaraki; Tasao Soga; Kazuji Yamada, both of Hitachi; Mitugu Shirai, Hadano, all of Japan

[73] Assignee: Hitachi, Ltd., Tokyo, Japan

[21] Appl. No.: 202,027

[22] Filed: Jun. 3, 1988

[30] Foreign Application Priority Data

Jun. 5, 1987 [JP] Japan .................................. 62-139791

[51] Int. Cl.$^4$ ........................ H05K 3/34; B23K 35/02; B23K 37/06
[52] U.S. Cl. ..................................... 228/245; 228/246; 228/254; 228/256; 228/179; 228/13; 228/17; 29/882
[58] Field of Search ...................... 228/179, 180.2, 123, 228/254, 256, 259, 13, 14, 17, 56.3; 29/882; 269/903; 118/401; 156/232, 238

[56] References Cited

U.S. PATENT DOCUMENTS

| | | | |
|---|---|---|---|
| 3,320,658 | 5/1967 | Bolda et al. | 228/180.2 |
| 3,373,481 | 3/1968 | Lins et al. | 228/180.2 |
| 3,472,365 | 10/1969 | Tiedma | 228/56.3 |
| 3,531,852 | 10/1970 | Slemmons et al. | 228/5.1 |
| 3,719,981 | 3/1973 | Steitz | 228/123 |
| 4,209,893 | 7/1980 | Dyce et al. | 228/56.3 |
| 4,216,350 | 8/1980 | Reid | 228/56.3 |
| 4,705,205 | 11/1987 | Allen et al. | 228/180.2 |
| 4,722,470 | 2/1988 | Johary | 228/259 |
| 4,759,491 | 7/1988 | Fisher | 228/259 |

FOREIGN PATENT DOCUMENTS

| | | | |
|---|---|---|---|
| 2421557 | 12/1974 | Fed. Rep. of Germany | 29/882 |
| 138371 | 10/1979 | Japan | 228/254 |
| 35935 | 3/1983 | Japan . | |
| 234396 | 11/1985 | Japan . | |

OTHER PUBLICATIONS

IBM Technical Disclosure Bulletin, "Cast Solder Preloading . . . ", vol. 20, No. 2, pp. 545, 546, Jul. 1977.

Primary Examiner—Nicholas P. Godici
Assistant Examiner—Samuel M. Heinrich
Attorney, Agent, or Firm—Antonelli, Terry & Wands

[57] ABSTRACT

The invention relates to a solder carrier comprising a sheet of self-support type, made of a material which does not react to a solder when it is melted, a plurality of small through holes, and solder filling the through holes, each of the small through holes having an end, the area of which is larger than that of the other end. By using this solder carrier, a semiconductor device can be flip-chip-connected to a carrier substrate through a bump method, and solder balls can be formed for connecting the carrier substrate to a multilayer circuit board. The through holes of the solder carrier, each of which holes is to be filled with solder, is formed by etching, and the solder is inserted in the holes under pressure by a roll or the like.

2 Claims, 2 Drawing Sheets

SOLDER CARRIER, MANUFACTURING METHOD THEREOF AND METHOD OF MOUNTING SEMICONDUCTOR DEVICES BY UTILIZING SAME

BACKGROUND OF THE INVENTION (1) Field of the Invention

This invention relates to a method of mounting a semiconductor device and etc., and more particularly relates to a solder carrier for simultaneously forming bumps on a plurality of small precise connecting terminals, each bump being made of a predetermined constant quantity of solder.

(2) Description of the Prior Art

As regards conventional methods of forming bumps for the purpose of connecting terminals in a method of mounting semiconductors, there have been known an evaporated solder bump method in which the bumps are formed by evaporating solder while using metal masks, and a solder-plating bump method (CCB Method: Controlled Collapse Bonding Method) in which the bumps are formed by solder-plating conducted while using solder resist masks.

Furthermore, a method is disclosed (Japanese Patent Laid-Open No. 58-35935) in which an organic insulating sheet having both through-holes formed by a punching method and solder balls filling the through holes is directly located on the bump portions of a semiconductor device, which sheet is then heated and bonded onto the bump portions of the semiconductor device through the molten solder secured to the bump portions. In this method, the insulating sheet, which serves as a ball carrier, per se is mounted on a semiconductor device, too.

A method is also disclosed (Japanese Patent Laid-Open No. 60-234396) in which a solder material is welded to pads by heating and fusing a plate-shaped jig having little wettability regarding solder and having conical or quadrangular pyramid-like grooves formed on the surface thereof which grooves are filled with solder paste.

The evaporated solder method has such shortcomings that unsuitable variation in the amount of applied solder occurs and that, since the vapor pressure of Sn is high, in a case of obtaining a required composition in which the proportion of Sn is high, for example, Pb/Sn=4/6, several tens of hours become necessary. On the other hand, in the solder-plating method, a degree of variation in amount of applied solder becomes higher, and a large number of manufacturing steps are required.

Furthermore, in the method described above in which an organic sheet is used the following problems arise:

(1) Since a puncher is used, it is necessarily difficult to realize a high-density distribution of holes.

(2) Since the solder balls need to be supplied to a plurality of small through holes bored in the organic sheet without dropping therefrom, it becomes difficult to produce the carrier sheets.

(3) It is difficult to manufacture solder balls uniform in both shape and dimensions. Even if it is possible, the solder balls are apt to drop from the through holes and are therefore difficult to handle since the sheet employed is a thin film (100 $\mu$m in thickness) sheet.

(4) Even if a polyamide sheet having excellent heat resistance is used as the organic sheet, when the sheet is heated up to the temperature at which the solder melts, residual strain occurring at the time of forming the holes is relieved to cause deformation of the sheet because of thin thickness of the sheet, which deformation makes it impossible to correctly place the sheet in place.

Problems therefore arise in this method if used as a solder carrier for forming solder balls mounted on a semiconductor device in which high precision and high density are required.

Furthermore, in a method in which the conical or quadrangular pyramidal grooves are formed in a jig made of a material, such as polytetra-fluoroethylene or stainless steel, having little wettability regarding solder in which jig a material for soldering fills the grooves, it is difficult to insert a constant amount of solder to the jig. The solder to be inserted must be fused, but such fused solder becomes spherical in shape due to the surface tension caused by the inferior wettability of the jig. Therefore, if excess parts of the solder that projects over the surface of the jig are removed by a sqeegee or the like, even a part of the fused solder filling the grooves in the form of a sphere will be also removed together with the excess solder. It is therefore difficult to supply a constant amount of solder to these conical or quadrangular pyramidal grooves.

SUMMARY OF THE INVENTION (1) Objects of the Invention

An object of the present invention is to provide a solder carrier and a method of manufacturing the same, the solder carrier being capable of simultaneously forming uniform solder bumps with a constant amount on a plurality of small connecting terminal portions of a semiconductor device.

Another object of the present invention relates to a method of simultaneously forming uniform bumps with a constant amount of solder on a plurality of small connecting terminal portions of a semiconductor element or a semiconductor device.

(2) Statement of the Invention

A solder carrier of the invention comprises: a sheet of a self-support type made of a material which does not react to a molten solder, a plurality of small through holes formed therein each of which has an opening end having a larger area than that of the other opening end; and solder filling said through holes.

Another solder carrier of the invention comprises: a solder; a plurality of small through holes formed in a sheet of a self-supporting type made of a material which does not react to the molten solder filling the holes by an amount required to form bumps, the through holes each having an upper opening end area which is larger than a lower end opening area, and each of the through holes being formed unsymmetrically in its longitudinal cross-section.

By making the upper opening end area of each through hole larger than the lower end opening area of the same, the solder becomes spherical due to its surface tension and swells in the upper portion having the larger area when the solder is fused. As a result of this, bumps can be readily formed.

Furthermore, the upper-half and the lower-half of longitudinal cross-section of each through hole is preferably unsymmetrical. As a result of this, the solder filling the holes can be prevented from dropping from the holes.

Even if both the upper end opening area of each through hole and the lower end opening area are the same, a portion having a small cross-sectional area may be provided in the lower intermediate position of the through hole. As a result of this, the fused solder becomes spherical due to its surface tension and swells in the upper portion of the through hole. However, a degree of the swell is small in comparison with that achieved in the former case, and it becomes difficult to fill the holes with solder by pressure.

The capacity of each small through hole of the solder carrier is preferably substantially the same as the volume of the solder needed to form a bump of the type described above.

The sheet, of course, needs to be made of a material which does not react to the solder when the solder is in a molten state and which has little wettability regarding the molten solder.

The solder carrier can be manufactured by a method comprising the steps of applying an etching resist to a sheet made of a material which does not react to a molten solder, forming a plurality of sheet-exposing openings at the positions at which solder bumps are to be respectively formed, forming through holes in the sheet by the etching of the sheet through the openings, and filling the through holes with solder by applying pressure.

The etching can be effected in a usual manner. For example, a through hole that has unsymmetrical longitudinal cross-section can be formed by making the degree of etching different between two sides of the carrier sheet which different degree of etching is obtained by making the temperature or density of the etching agent different between the two sides. If the size of the openings formed in the photoresist film is different between two sides, the amount of etching is necessarily made different, therefore, the through holes in the form of a truncated cone can be formed without effecting the above-described control.

These methods can be selected and combined in accordance with requirements regarding the shape of the through holes, material and the thickness of the sheet. As for the etching agent, it is determined in accordance with the material of the carrier sheet, and there are a usually used marble liquid ($CuSO_4$ and inorganic acid are included) and another liquid including ferric chloride and hydrochloric acid. In order to raise the etching speed, it is preferable for the etching to be conducted while stirring the etching agent or while applying supersonic waves to the same.

The sheet needs to have such properties that the small through holes can be relatively readily formed by etching, that the sheet does not react to the molten solder, and that none of melting, deformation and contraction occur when the solder is fused. Furthermore, the sheet needs to have little wettability with respect to a molten solder.

For example, a sheet made of stainless steel, molybdenum, tungsten, FENICO (Fe-Ni-Co alloy), or ceramics material is used. If necessary, a chromium plating may be applied to the sheet. The dimensions of the sheet such as film thickness and width can be determined in accordance with the amount of the solder to be inserted and the solder bump pattern and the objects for use.

A solder for use in this invention is a type generally used in forming bumps of semiconductor devices. For example, this is a Pb-Sn alloy, Sn-Ag alloy, or Pb-In alloy.

As described in the embodiment hereinafter, a required solder carrier can be obtained by filling the through holes in the sheet with a solder at a temperature lower than that at which the solder fuses, for example, at room temperature by applying pressure to the solder. For example, in a case where a stainless steel sheet is used as the sheet and Pb-Sn (Sn of 60% and the balance Pb) alloy solder is employed, the solder can be inserted under pressure of 300 to 400 $kgf/cm^2$ into the through holes. The inserting of the solder is conducted by rolling or pressing. The higher a temperature at which the solder is inserted, the lower a pressure required to insert the solder into the holes becomes, under such condition that the temperature does not reach the melting point of the solder. However, since the solder is oxidized at a high temperature, the solder must be inserted in an atmosphere of inert gases if the inserting is effected at a high temperature.

By covering the sheet surface with a coating of a mold release agent, the residual solder film (residual solder foil) remaining on the sheet surface after feeding the solder to the through holes can be removed. It can also be readily removed by mechanical grinding the surface of the sheet. Further, it can be removed by making the photoresists remain and then by scraping both the photoresist and the remaining solder foil together which photoresist had been formed for effecting the etching.

The present invention provides as a second aspect thereof a method of mounting a semiconductor device in which method solder bumps provided on the semiconductor device are heated and fused so that the semiconductor device is connected to a circuit substrate, the method comprising the steps of: preparing a solder carrier having a sheet of a material which does not react to molten solder and having both a plurality of small through holes formed at positions which correspond to the portions at which the solder bumps of the semiconductor device are to be formed and solder filling the through holes; heating the solder carrier to the melting point of the solder; and bringing the solder carrier into contact with bump-forming portions of the semiconductor device, at which portions the solder bumps are to be formed, so that solder balls are formed.

The solder which has been fused in the through holes in the solder carrier has a tendency to become spherical due to its surface tension. That is, if the through hole of the solder carrier is formed in such a manner that it outwardly extends divergently like an umbrella, the force to push the solder toward an opening end having a wider area is generated due to the surface tension of the solder, with the result that the solder is swollen. When the thus-swollen solder is brought into contact with the pads of a microchip carrier, the solder forms a spherical shape due to its surface tension.

Especially, by using a sheet which do not react to the molten solder as solder carrier sheet, all the solder provided in the carrier can be formed in a spherical shape, as a result of which, the amount of the solder forming the bumps can be prevented from varying.

EXAMPLE

Figure 1:
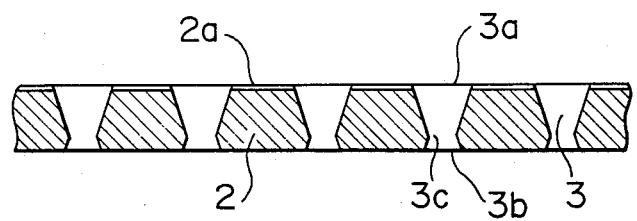
FIG. 1 is a cross-sectional view of a solder carrier according to an embodiment of the present invention.

FIG. 1 is a cross-sectional view of a solder carrier sheet 2 according to the present invention. As a sheet which does not directly react to the solder when the solder is in a molten state, a 0.25 mm-thick stainless steel sheet was used. In this sheet, through holes 3 were formed by etching, the through holes being arranged to correspond to a pattern (having dimensions of 20×20 cm$^2$, and 2×3 pieces of patterns each of which had 300 pieces of solder bumps) of small connecting terminals of a microchip carrier 7 of a semiconductor device shown in FIG. 4.

The etching was conducted in such a manner that a photoresist (manufactured by Tokyo Ouka Co., Ltd. having a trade mark of OMR-83) made of an organic photosensitive material was applied to both sides of the sheet, patterning was performed by a photo-lithography method to form a resist film, and dipping it in a etching liquid (30° C.), while stirring the liquid, so as to effect the etching on both sides of the sheet, which etching liquid includes $CuSO_4$:4g 35% HCl:20 ml, and water:20 ml The photoresist on the surface of the carrier sheet was dissolved and removed by using an organic solvent after the etching had been completed. In this etching, the size of the opening provided in the photoresist on a side (upper side 3a) which is to contact with a semiconductor device surface on which the solder bumps of the semiconductor device are to be formed was made to have a diameter of 320 μm, and the size of the same on another reverse side (lower side 3b) was made to have a diameter of 250 μm. As a result of this, as shown in FIG. 1, the truncated cone through holes 3 each of which was unsymmetrical in a longitudinal cross-section, and two ends of which were different in diameter could be precisely formed. The longitudinal-sectional area of a portion provided with the end of the larger diameter was larger than that of another portion provided with the end of the smaller diameter.

Figure 3:
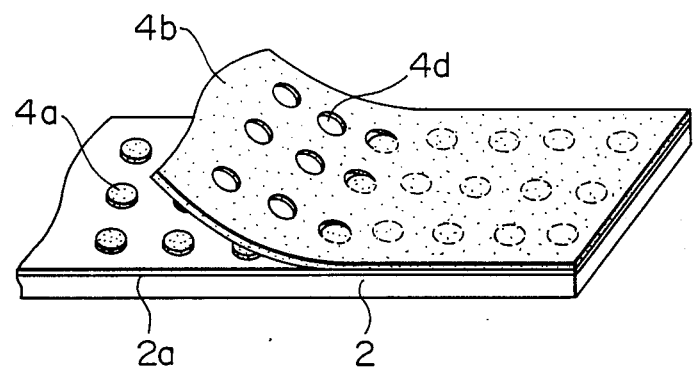
FIG. 3 is a perspective view of the solder carrier illustrating the state of the separation of the residual solder foil from the surface of the solder carrier according to the present invention.

Each of the through holes 3 had a capacity which was sufficient to form a Pb-Sn (Sn of 60wt% and the balance Pb) alloy solder bump with 300 μm in diameter, through which bump the semiconductor element 8 shown in FIG. 3 was mounted on a multilayer circuit substrate. The diameter of the upper end 3a of the through hole 3 was 320 μm, the diameter of the lower end 3c was 250 μm, and the diameter of the narrowest portion 3C provided in the through hole was 200 μm.

Figure 2:
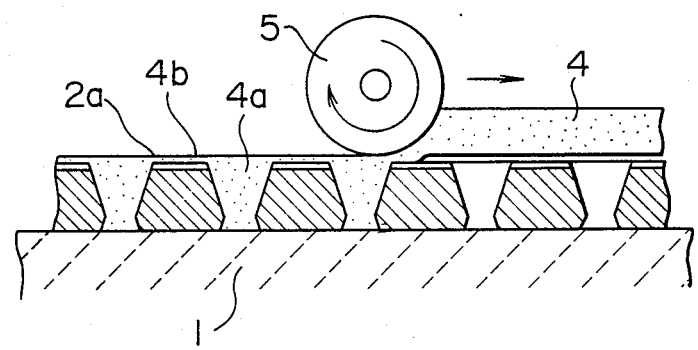
FIG. 2 is a cross-sectional view showing a method of manufacturing the solder carrier.

The Pb-Sn alloy solder 4 was inserted under pressure in the through holes 3 provided in the carrier sheet 2 obtained in a manner shown in FIG. 2.

The inserting of the solder 4 is conducted on a flat plate 1 which does not deform by applied pressure and which plate is made of a material which does not react to the molten solder. Solder foil 4 of 0.30 μm in thickness was put on the upper surface of the carrier sheet 2, a roller 5 of 600 mm in diameter was used, and the solder 4 was inserted in the holes under a pressure of 400 kgf/cm$^2$ at room temperature.

After the insertion of the solder, foil-shaped solder 4b (residual solder foil) remained on the surface of the carrier sheet 2, which solder 4b was then ground by a rotatable microcutter.

As schematically shown in FIG. 3, the residual solder foil 4b may be also removed by a scraping manner. By either manner, the solder inserted in the through holes was not removed.

Figure 4A:
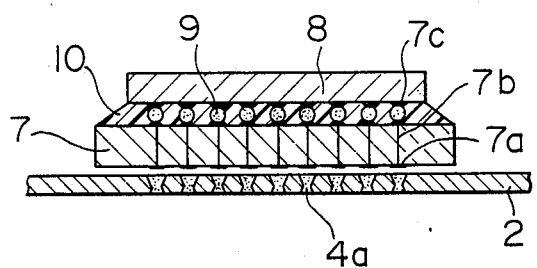
FIGS. 4a, 4b and 4c are schematic views illustrating the state in which solder bumps on the semiconductor device are formed.

Then, in a semiconductor device shown in FIG. 4(a), the solder carrier 2 the surface of which is coated with a solder flux of resin type was brought into contact with a surface 7a of the microchip carrier 7 at which the solder bumps are to be formed, and they were heated to the temperature at which the solder is fused. As a result of the application of the solder flux, it became possible to effectively form the molten solder into a spherical shape.

Figure 4B:
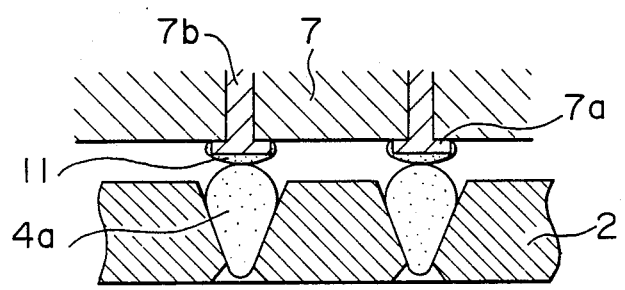

Before the solder balls 4a were formed by use of the solder bumps, a slight amount of solder 11 (the composition of which is the same) had been previously applied on each pad 7a of the microchip carrier 7 by ultrasonic wave soldering, as shown in FIG. 4(b).

Figure 4C:
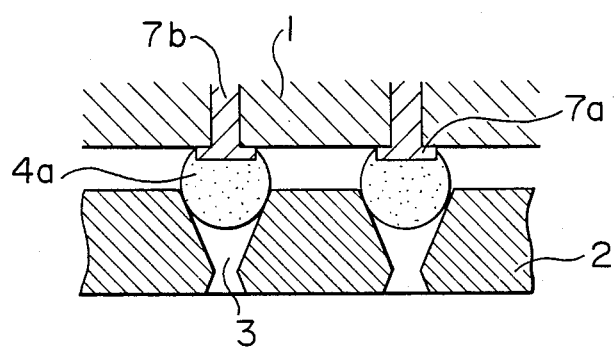

The solder bumps were formed by heating and fusing the solder provided in the carrier sheet at 240° C. in an infrared ray furnace in which an atmosphere was variable. The solder which had been heated and fused was, as shown in FIG. 4(b), upwardly swollen with its shape becoming partially semi-spherical. When the pad 7a contacted with the thus-swollen solder, the spherical bumps could be, as shown in FIG. 4(c), formed.

As described above, the semiconductor device can be mounted on and connected to the pads of a circuit substrate by using the solder bumps formed on the small connecting terminal portion of the semiconductor device after the locations of both the semiconductor device and the pads of the circuit substrate had been aligned with each other. The heating conditions may be determined in taking both the material of the circuit substrate and the properties of the semiconductor device into consideration. If necessary, the heating can be conducted in an inert gas, such as a nitrogen gas or an argon gas.

In FIG. 4(a), a semiconductor element 8 and the microchip carrier 7 were connected by a CCB method while using a high melting-point solder 9 (Pb-Sn: Sn of 5 wt% and the balance Pb, melting-point 290 to 310° C.), and spaces defined around the solder 9 were filled with a resin having inorganic particles and rubber particles so as to connect the element 8 and the microchip carrier 7 to each other. Since the solder in the solder carrier according to the present invention had a lower melting point than the high melting point solder 9, the semiconductor "device" (semiconductor element 8 plus microchip carrier 7) could be connected to the circuit substrate without any influence on the connected portion. Furthermore, if a part of the semiconductor device mounted on the circuit substrate is broken, it can be readily replaced.

According to the carrier of the present invention, a plurality of bumps can be simultaneously formed on small electrodes of a semiconductor device. Furthermore, the semiconductor device can be, of course, connected to the microchip carrier by a method according to the present invention.

Figure 5:
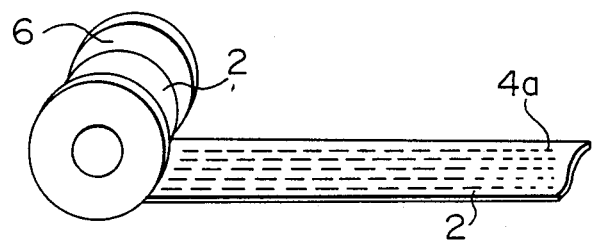
FIG. 5 is a perspective view illustrating the state in which the solder carrier according to the present invention is wound around a bobbin.

The solder carrier according to the present invention can be formed in an elongated sheet shape as shown in FIG. 5 by using a metallic sheet. If it is wound around a bobbin 6, the solder inserted in the carrier does not readily drop therefrom, as a result of which, a great advantage can be obtained to achieve the mass-production of the mounting of semiconductors.

By using the solder carrier according to the present invention, uniform solder bumps each having a constant amount of solder can be readily formed on the connecting terminal portions of a semiconductor device. Consequently, a high reliability can be obtained when a semiconductor device having high density and precise solder bumps is mounted on a circuit substrate, and a great advantage can be obtained in manufacturing an electronic circuit device.

We claim:

1. A method of manufacturing a solder carrier comprising:
    preparing a solder;
    applying an etching resist coating to a sheet made of a material which does not react to the solder in a molten state;
    forming a plurality of openings at the positions at which solder bumps are to be formed;
    forming through holes by etching said sheet through said openings; and
    filling said through holes with the solder under pressure.
2. A method of manufacturing a solder carrier according to claim 1, wherein said sheet is made of a material which has little wetability with respect to a molten solder.

* * * * *